United States Patent [19]

Richter

[11] Patent Number: 4,902,851

[45] Date of Patent: Feb. 20, 1990

[54] COMBINATION PROTECTION ROOM

[75] Inventor: Klaus Richter, Berlin, Fed. Rep. of Germany

[73] Assignee: ABS Allgemeiner Brandschutz, Fed. Rep. of Germany

[21] Appl. No.: 234,719

[22] Filed: Aug. 19, 1988

[30] Foreign Application Priority Data

Aug. 20, 1987 [DE] Fed. Rep. of Germany ....... 3728055

[51] Int. Cl.$^4$ ............................................. H05K 9/00
[52] U.S. Cl. ............................................. 174/35 MS
[58] Field of Search ...................... 174/35 MS, 35 GC; 109/1 S

[56] References Cited

U.S. PATENT DOCUMENTS

| | | | |
|---|---|---|---|
| 2,974,183 | 3/1961 | Kes et al. | 174/35 GC |
| 3,584,134 | 6/1971 | Nichols | 174/35 MS |
| 3,589,070 | 6/1971 | Hansen | 174/35 MS |
| 4,628,826 | 12/1986 | Richter | 109/1 S |
| 4,710,590 | 12/1987 | Ekdahl | 174/35 MS X |
| 4,729,326 | 3/1988 | Richter | 109/1 S |

Primary Examiner—Leo P. Picard
Assistant Examiner—David A. Tone
Attorney, Agent, or Firm—Arnold S. Weintraub; William D. Blackman

[57] ABSTRACT

A combination protection room against the action of heat in the case of a fire, water steam and gas, as well as magnetic and electric fields is proposed, which comprises walls with several layers of fire protection materials, which are not interconnected and are self-supporting, together with an inner metal envelope made from individual sheet metal elements. The combination protection room also has a fire protection door with a through metal plate, and the transition points between the individual sheet metal elements and between the latter and the metal plate of the fire door are provided with steam-gas seals, which are electrically and magnetically conductive and elastic.

13 Claims, 3 Drawing Sheets

COMBINATION PROTECTION ROOM

BACKGROUND OF THE INVENTION

1. Field of the Invention

The present invention relates to a combination protection room or shelter against the action of heat, water and steam or gas under pressure, and magnetic and electric fields in the medium to super-high frequency range.

2. Prior Art

In the past, certain advances have been made in the fire protection field relative to fire protection rooms in which it is possible to walk and in which particular data carriers can be stored, e.g., EP 85730092.5. In the known fire protection room, the walls surrounding the inner area are made from several insulating layers, such as fire protection plates, gypsum or plaster board plates and/or rock fibre plates or the like, which are set up independently of one another and are self-supporting and are not mechanically interconnected. Between them is arranged a support mechanism formed from metallic profile carriers, while sheet metal elements are located on the inside.

In order to ensure adequate fire protection, also in the transition area between the inside and outside, e.g., in the vicinity of the door, special door elements have been developed (German Patent Applications P 36 40 467.5 and P 36 40 466.7), which also comprise a plurality of insulating layers and which, like the soffit surrounding the door opening, are multiply stepped and folded. The door is held on support structure located in the inner area in front of the wall, so that the load does not act on the wall or ceiling of the protection room. By means of control levers, on opening, the door first moves parallel to the door opening in the outward direction and is then pivoted round. The known door elements have an actuating mechanism, which can be operated both from the inside and from the outside. A shaft passing through the door wall is provided, which has a fire protection separation. It has been found that such known fire protection rooms with the aforementioned door elements very adequately fulfill all fire protection conditions.

Interception protection rooms are also generally known, in which a protection against the transmission of electric and magnetic fields in the radio frequency range is provided by metal shields.

However, hitherto, no protection room has been known, which is able to simultaneously satisfy the protection requirements against high temperatures and undesired heat transfers, the action of water and steam or gas and electromagnetic interference fields. The reason for this is that these three set problems require for their individual solutions in each case different materials, which are each prejudicial to the solutions of the other problems as a result of their technical and physical requirements, so that hitherto no attempt has been made to combine all three protection needs.

The problem of the present invention is therefore to provide a combination protection room, e.g., for safe working with data processing equipment, which even in the case of high external temperatures in the case of a fire does not allow an excessive temperature rise in the inner area, which is steam-tight and is simultaneously "tight" with respect to electromagnetic fields and able to combine in one structure the known solution principles of fire protection, steam tightness and electromagnetic shielding.

A combination protection room in accordance with the present invention, generally, comprises:

(a) walls made from several layers of fire protection materials, which are not interconnected and are self supporting;

(b) an internal metal envelope made from individual sheet metal elements;

(c) a fire door with a through metal plate; and (d) a plurality of steam-gas seals disposed at transition points between the individual sheet metal elements, and between the latter and the metal plate of the fire door, the steam-gas seals being electrically and magnetically conductive and elastic.

SUMMARY OF THE INVENTION

Through the provision of a room with walls made from several layers of fire protection materials, which are not interconnected and are self-supporting, in which there is an inner metal envelope made from individual sheet metal elements, between which are arranged steam-gas seals, which are electrically and magnetically "tight", a room is made available, which does not allow heat transfer from the outside to the inside, in which the fire protection door closing the passage into the room has an internal metal plate, which is also connected in gas-tight and electromagnetically conductive manner with the sheet metal elements surrounding it.

Advantageously the steam-gas seal comprises an elastomeric central element and side parts made from a knitted or braided means made from thin, metallic wires, the necessary damping being determined by the ratio between the cavities in the knitted means and the pressure applied thereto in the fitted state.

It has been found that the most favorable shielding values are obtained if the metal knitted means, preferably of copper-plated and subsequently tin-coated steel wires is compressed in the fitted state to ⅓ of its original thickness, so that even in the case of incorrect fitting excessive tightening of the connecting screws between the components to be provided with steam-gas seal does not lead to an excessive compression of the metal knitted means, whose shielding action is significantly deteriorated beyond a specific compression ratio, one or more inserts are embedded in the elastomeric element, which prevent compression over and beyond a given amount.

Reliable sealing on the door is brought about by the moving in of an all-round cutting edge between two metal springs, which are connected to the metal plate of the door. The cutting edge additionally presses into an elastomeric sealing strip.

In order that electromagnetic waves not penetrate through the passage needed for the operation of the door, it is advantageous to provide a steel tube engaging round the operating shaft and which is tightly connected to the metal plate of the door, the operating shaft being made from plastic within the steel tube. And adequate damping of the electromagnetic waves is ensured if the internal diameter of the steel tube is equal to or smaller than 3 cm and if its length is greater than or equal to four times the internal diameter. The steam tightness is ensured by an elastomeric seal or packing arranged between the operating shaft and the steel tube at the cold end. For an adequate fire protection, it is helpful to provide the outwardly directed end of the steel tube with a material which is foamable in the case of a fire.

As working generally takes place in the room with the door closed, said room e.g., containing data processing equipment or the like, it is necessary to provide an air conditioning flap connected to an air conditioning plant. The fire protection and the protection against penetration of steam or gas must be effective when the door and air conditioning flap are closed, while the interception protection must be ensured when the door is closed and the air conditioning flap is open. Thus, according to the invention, the air conditioning duct is advantageously constructed as a sheet metal duct, in whose flow-cross section is inserted a known honeycomb flue insert which is connected to the sheet metal duct. The latter continues in multiply bent manner and accompanied by the interposing of electrically and magnetically conductive, elastic steam-gas seals between the frame and the air conditioning flap and the walls up to the inner sheet metal element and as a result of the damping characteristics with respect to the electromagnetic waves it is at least partly possible to choose a very thin metal sheet, so that the fire protection is not significantly impaired.

BRIEF DESCRIPTION OF THE DRAWINGS

The invention is described in greater detail hereinafter relative to non-limitative embodiments and the attached drawings, which show.

DETAILED DESCRIPTION OF THE PREFERRED EMBODIMENTS

Figure 1:
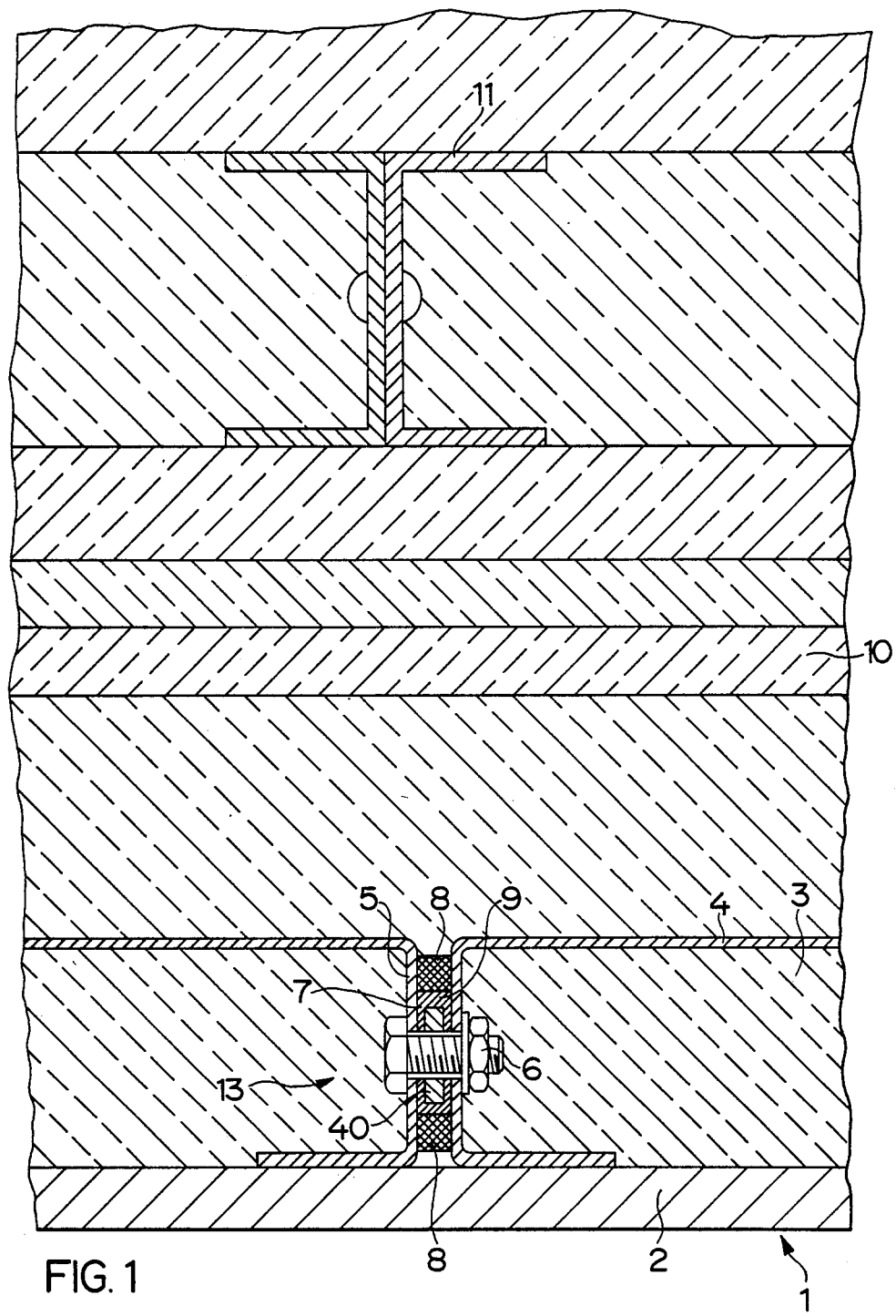
FIG. 1 a partial cross-section through a wall of the combination protection room.

The wall 1 shown in FIG. 1 has a multilayer construction, which also applies with regard to the ceiling of the combination protection room. The surface 2 facing the inner area and which is essentially used for visual and aesthetic lining purposes, can be formed by the surface of a layer 2 of drywall panelling, wood or the like. Adjacent to the inner layer 2 is provided a thermal insulation layer 3, which is inserted in sheet metal elements 4, which are constructed in U-shaped manner at their intersection points, the bottoms 5 of the individual sheet metal elements 4 being connected by screws 6, bolts or the like. Between the sheet metal elements 4 is provided a packing or seal 7, which is both electrically and magnetically conductive, while at the same time being elastic and steam or gas-tight. The sheet metal elements 4 are used for shielding electromagnetic waves and, preferably, comprise galvanized steel sheets with a thickness of 1.25 mm. The sheet thickness is defined as a function of the necessary damping or attenuation of the electromagnetic waves in the frequency range of at least 10 KHZ to 10 GHZ.

Packing 7, which must not interrupt the electromagnetic shielding by the sheet metal elements, is constructed in strip-like manner and is formed from a core or central part 9 made from rubber or some other elastomeric material and side parts 8 constituted by a knitted means of thin, metallic wires, preferably nickel-coated, copper-plated steel wires in the manner of wire wool. The side parts 8 are interconnected with the central part 9 by bonding or are vulcanized on. The cavities in the side parts formed by the knitted wire means are as decisive of the damping or attenuation action as the actual wires, and the ratio of the cavities to the compression of the knitted metal means 8 determines the necessary damping, which should be 60 dB for the magnetic field and 100 dB for the electric field. Very good shielding values are obtained if the knitted metal means 8 is compressed to ⅓ of its original thickness. If the central part 9 is made from rubber, then washers 40 are vulcanized in at the drilling points for the screw connection 6 and are dimensioned in such a way that in the compressed state the knitted metal means a is compressed to the desired extent and simultaneously the rubber central part 9 has a steam-sealing action. Therefore the washers have a thickness which is preferably approximately ⅓ of the thickness of the knitted metal means.

In another embodiment of packing 7, it is formed throughout from a knitted wire means and in the central part is cast or otherwise incorporated rubber or an elastomeric material.

As can also be gathered from FIG. 1, the wall comprises further layers 10, which are constructed as thermal insulation materials of different types and it is additionally possible to incorporate drywall panels. After a number of layers 10 are provided a support mechanism 11, is added, constituted by metal profiles, e.g. U-supports, which are interconnected and thermal insulation material is placed in the profiles. The individual layers of the sandwich structure of the walls are not interconnected and are self-supporting, i.e., there is no heat transfer via any connecting elements.

Figure 2:
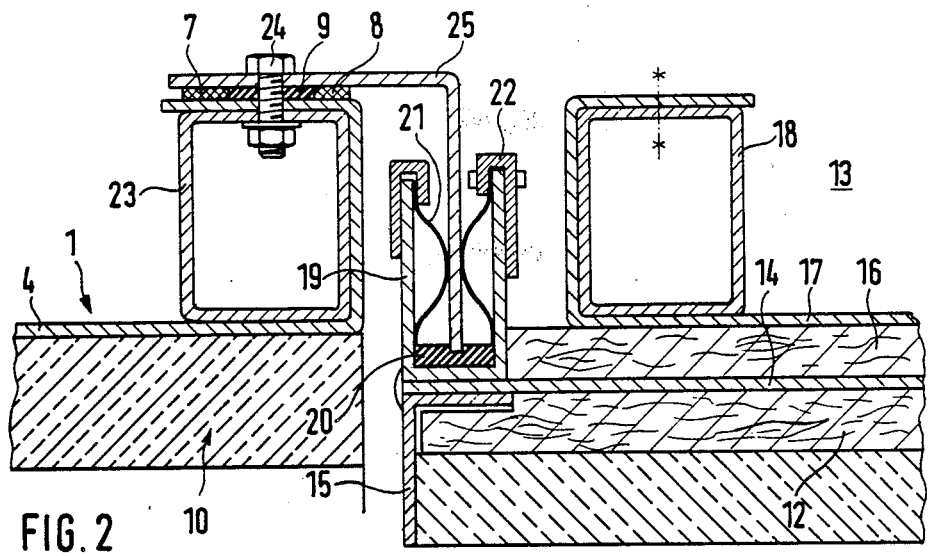
FIG. 2 a section through part of the door and adjacent wall with electrical and magnetically conductive steam-gas seal.

FIG. 2 shows part of a fire door 12, which is inserted in wall 1. The individual layers of both the wall and the door 12 are not shown, because they correspond with those of FIG. 1. Towards the inner area 13, door 12 is provided with a through metal plate 14, which is welded to the door angle 15, direct viewing of the metal plate 14 from the inner area 13 being prevented by a drywall panel 16 and additionally a layer of galvanized sheet metal 17, which is screwed to a square tube 18. All round the door a U-section 19 is connected, e.g., by welding to metal plate 14. In the bottom of the U-section 19 is firmly inserted in all-round manner a sealing strip 20 made from soft rubber or the like. Two thin all-round metal springs 21, preferably made from bronzeberyllium are fixed in a facing, tensioned manner, e.g., by shims 22 laterally to the U-section 19.

Around the door opening is provided a square tube 23, which is connected to the adjacent sheet metal elements, the square tube 23 being inserted in the bent ends of the sheet metal elements 4. A bent cutting edge 25 is connected to the sheet metal element 4 or the square tube 23 by means of screws 24 and while interposing therebetween the strip-like, electrically and magnetically conductive steam-gas seal or packing 7. The cutting edge 25 also passes round the entire door opening and when the door is closed engages in the U-section 19 between the metal springs 21 and presses into the sealing strips 20. A gas tightness between the door 12 and the wall 1 is therefore ensured by the cutting edge 25 pressing into the sealing strip 20 and by the central part 9 of seal 7 between cutting edge 25 and the sheet metal element 4, while the electrical and magnetic connection results from the contact of cutting edge 25 with metal springs 21 and via the knitted wire means 8 of packing 7. According to FIG. 2, on opening, the door 12 moves forward parallel to wall 1 and to the door opening, so that the cutting edge slides out of the U-section and contact between the metal springs 21 and the cutting edge 25 discontinues. Only after a complete separation has taken place is the door swung. The corresponding procedure is adopted in closing the door.

Figure 3:
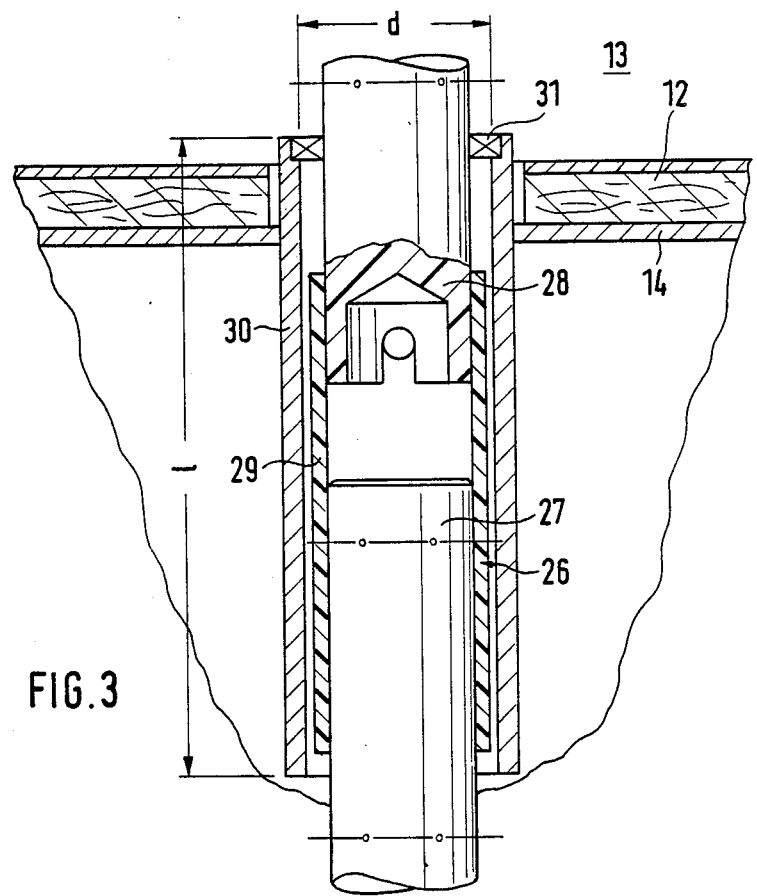
FIG. 3 a section through part of the door with part of the operating mechanism.

FIG. 3 shows part of the door 12, while part of the operating mechanism of the door is also shown. Door 12 can be opened both from the inside 13 and from the outside and for this purpose a shaft 26 is provided. Shaft 26 comprises two partial shafts 27,28, which have a spacing between them and the connection between the two partial shafts 27,28 is provided by a plastic sleeve 29. A preferably steel tube 30 is provided for electromagnetic shielding purposes and is tightly welded to the metal plate 14. A steam and gas seal 31 is positioned between partial shaft 28 and steel tube 30 at the end of tube 29. It is important for effective shielding purposes that the steel tube 30 has an internal diameter d of 3 cm or less, while the length 1 of the steel tube is equal to or greater than four times the internal diameter, and there must be no metal in the interior of the steel tube 30. This means that the partial shafts 27,28 and the connections to the plastic sleeve 29 must be made from plastic, whereas outside the steel tube 30, partial shafts 27,28 can once again pass into steel shafts. In order to provide a good fire protection seal, the end of the steel tube facing the outer area is surrounded by a material which is foamable in the case of a fire.

Figure 4:
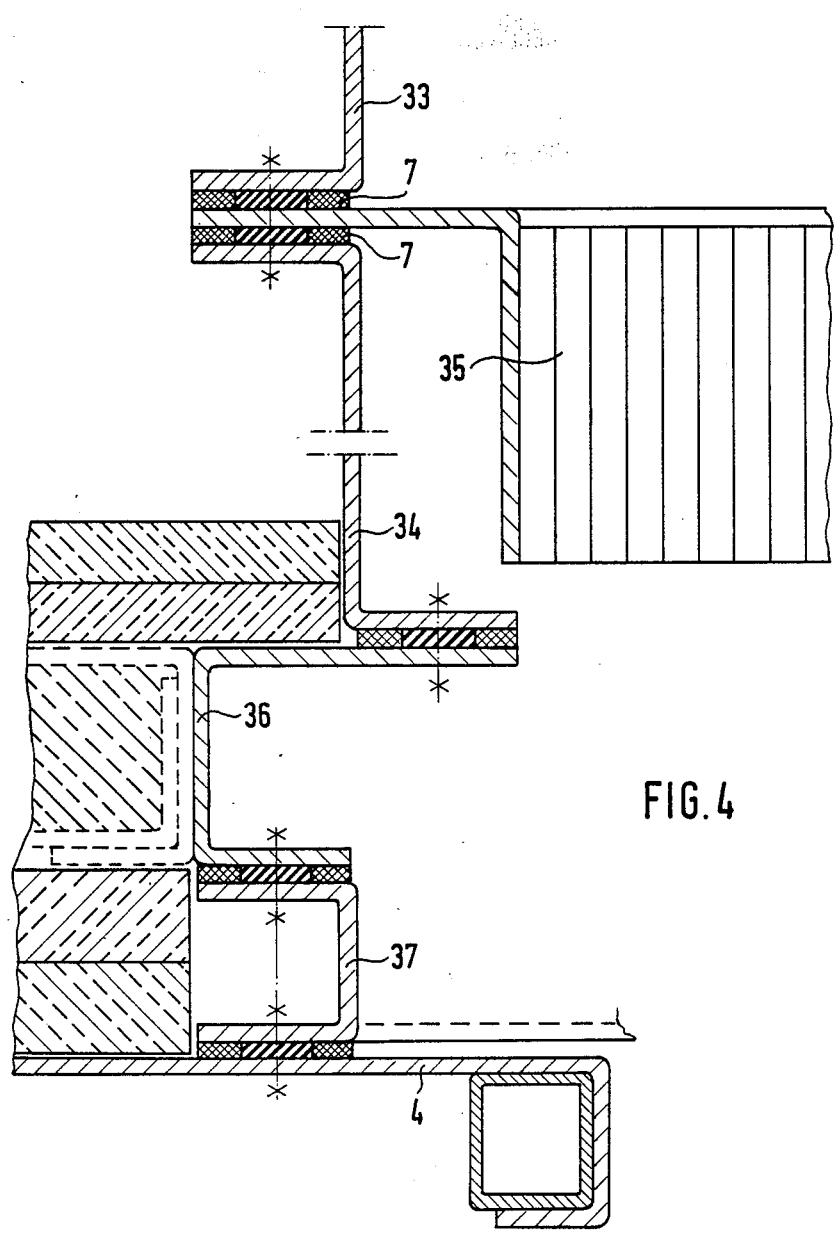
FIG. 4 a part section through the air conditioning duct with a connection to the inner metal envelope.

FIG. 4 shows the connection of the air conditioning flap in the walls according to FIG. 1 to a building-side connecting duct 33 for an air conditioning plant. For this purpose the connecting duct 33 is connected to a sheet metal duct 34 preferably made from 1.25 mm steel sheeting, the connection points being provided with the electrically and magnetically conductive steam and gas seal or packing 7. In addition, at the connecting points is provided a known honeycomb flue insert 35, which shields the flow cross-section of the air conditioning duct against electromagnetic waves up to 1 GHZ. Between the wall and the air conditioning flap, which is not shown in detail, are provided all-round, multiply bent sheet metal elements 36,37, which via packing 7 are connected both to one another and to the sheet metal duct 34 and the internal sheet metal elements 4. These sheet metal elements 36,37 can be made from thinner metal sheets than the remaining shielding, so that there is only a slight heat transfer.

On taking account of the aforementioned constructional measures a walk-in combination protection room, e.g., as a room for containing data processing equipment is made available, which fulfills the requirements for fire protection, steam tightness and electromagnetic shielding.

I claim:

1. A combination protection room for protecting contents thereof against the action of heat in the case of fire, water, steam, and gas, as well as magnetic and electric fields, comprising:
    (a) walls made from several layers of fire protection materials, which are not interconnected and are self-supporting;
    (b) an internal metal envelope made from individual sheet metal elements disposed within each of the walls;
    (c) a fire door with a through metal plate formed in one of the walls; and
    (d) a plurality of steam-gas seals disposed at transition points between the individual sheet metal elements and between the sheet metal elements and the metal plate of the fire door, the steam-gas seals being electrically and magnetically conductive and elastic, each of the steam-gas seals comprising a central element formed from a resilient mterial with an insert embedded therein to act as a pressure stop.

2. A combination protection room according to claim 1, characterized in that the electrically and magnetically conductive steam-gas seals each have a knitted means made from thin metal wires, which is connected to an element made from rubber or a similar elastomeric material.

3. A combination protection room according to claim 2, characterized in that the element made from rubber or a similar elastomeric material forms the central part of the seal, to which the knitted metal means is bonded or vulcanized on one or more sides.

4. A combination protection room according to claim 2, characterized in that the element made from rubber or some similar elastomeric material is incorporated into the center of the knitted metal means.

5. A combination protection room according to claim 2, characterized in that the cavities in the knitted means are selected in such a way that in the case of a specific pressure of the seal on the surface to be sealed, the necessary damping or attenuation of the magnetic and electric field is obtained.

6. Combination protection room according to claim 2 characterized in that the knitted metal means comprises copper-plated steel wires, which are subsequently tin-coated.

7. A combination protection room according to claim 1, in which the fire protection door on opening, firstly performs a movement parallel to the wall and then swings, characterized in that the metal plate is connected to a metal, channel-like element passing round the edge of the door, that in the channel-like element a rubber or similar elastomeric sealing strip is provided on the bottom and laterally two facing metal springs are fixed and that on the inner wall surrounding the door opening is fixed an all-round metal cutting edge, which is on the one hand connected via the electrically and magnetically conductive steam-gas seal to the sheet metal elements and on the other hand engages in the metal springs of the channel-like element and presses with its edge against the sealing strip.

8. A combination protection room according to claim 1, further comprising:
    (a) a sheet metal duct disposed in one of the walls for communicating with an air conditioning plant; and
    (b) a honeycomb flue insert disposed in the flow cross-section of the sheet metal duct to protect against interference fields.

9. A combination protection room according to claim 1 characterized in that the specific pressure of the electrically and magnetically conducting steam-gas seal made from rubber or some similar elastomeric material ensures the steam tightness in the fitted state.

10. A combination protection room according to claim 1, characterized in that the inserts are constructed as shims, which are vulcanized into the holes for the screw couplings of the components.

11. Combination protection room according to claim 1, characterized in that the thickness of the insert is such that in the fitted state the knitted metal means is compressed to a predetermined amount and preferably corresponds to approximately ⅓ of the thickness of the knitted metal means.

12. A combination protection room for protecting contents thereof against the action of heat, gas, and electromagnetic radiation, comprising:
 (a) walls made from several layers of fire protection materials, which are not interconnected and are self-supporting;
 (b) an internal metal envelope made from individual sheet metal elements disposed within each of the walls;
 (c) a fire door with a through metal plate formed in one of the walls and a hollow metal tube which passes through the fire door and which is connected to the metal plate;
 (d) a plurality of steam-gas seals disposed at transition points between the individual sheet metal elements and between the sheet metal elements and the metal plate of the fire door, the steam-gas seals being electrically and magnetically conductive and elastic;
 (e) a shaft at least partially disposed in the hollow metal tube for opening the door; and
 (f) a resilient seal interposed the shaft and the hollow metal tube for preventing passage therepast of steam and gas.

13. A combination protection room according to claim 12, characterized in that for a reliable electrical shielding the internal diameter of the metal tube must be equal to or smaller than 3 cm and the length must be equal to or greater than four times the internal diameter.

* * * * *